(12) United States Patent
Gayle

(10) Patent No.: US 6,344,975 B1
(45) Date of Patent: Feb. 5, 2002

(54) MODULAR BACKPLANE

(75) Inventor: Christopher R. Gayle, San Jose, CA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/385,701

(22) Filed: Aug. 30, 1999

(51) Int. Cl.[7] .......................... H01R 23/68; H01R 12/16
(52) U.S. Cl. ......................... 361/788; 361/785; 439/65
(58) Field of Search .............................. 361/788, 748, 361/715, 722, 728, 736, 785, 784, 790, 792; 434/61, 65

(56) References Cited

U.S. PATENT DOCUMENTS

| | | | | |
|---|---|---|---|---|
| 4,220,382 A | * | 9/1980 | Ritchie et al. | ................. 339/17 |
| 4,571,014 A | * | 2/1986 | Robin et al. | .............. 339/14 R |
| 4,764,849 A | * | 8/1988 | Khan | .......................... 361/428 |
| 4,861,272 A | * | 8/1989 | Clark | .......................... 439/79 |
| 4,907,977 A | * | 3/1990 | Porter | ......................... 439/74 |
| 5,211,565 A | * | 5/1993 | Krajewski et al. | ............ 439/65 |
| 5,335,146 A | * | 8/1994 | Stucke | ........................ 361/785 |
| 5,429,521 A | * | 7/1995 | Morlion et al. | ............. 439/108 |
| 5,839,906 A | * | 11/1998 | Leshem | ........................ 493/61 |
| 5,887,158 A | * | 3/1999 | Sample et al. | .............. 395/500 |

* cited by examiner

Primary Examiner—Jeffrey Gaffin
Assistant Examiner—Hung Bui
(74) Attorney, Agent, or Firm—Haverstock & Owens LLP

(57) ABSTRACT

The process of prototyping circuits such as a backplane or a circuit board has been modularized for achieving marked reductions in costs, time, and construction errors. Rather than repeating the recurring tasks, such as making bus connections between different circuit boards, of the prototyping process, the present invention implements a plurality of modules which can be separably coupled into an assembly having a planar arrangement for prototyping circuits, where each module specializes in a particular task. In the preferred embodiment, the plurality of modules includes a data bus module, a switchable data bus module, a power bus module, and a wire-wrap module. Each one of the plurality of modules includes a coupling face configured for coupling to one or more circuit boards. Since the assembly is constructed by simply coupling one or more modules to one another, the present invention facilitates rapid and cost-effective prototyping of a variety of backplanes as well as facilitates reuse of the assembly in multiple prototyping processes by simply separating the one or more modules from one another. Moreover, the bus modules are internally configured to couple one or more circuit boards together, thus substantially lowering the need for wire-wrapping. Hence, the construction errors associated with wire-wrapping are substantially reduced, leading to quality improvements.

21 Claims, 3 Drawing Sheets

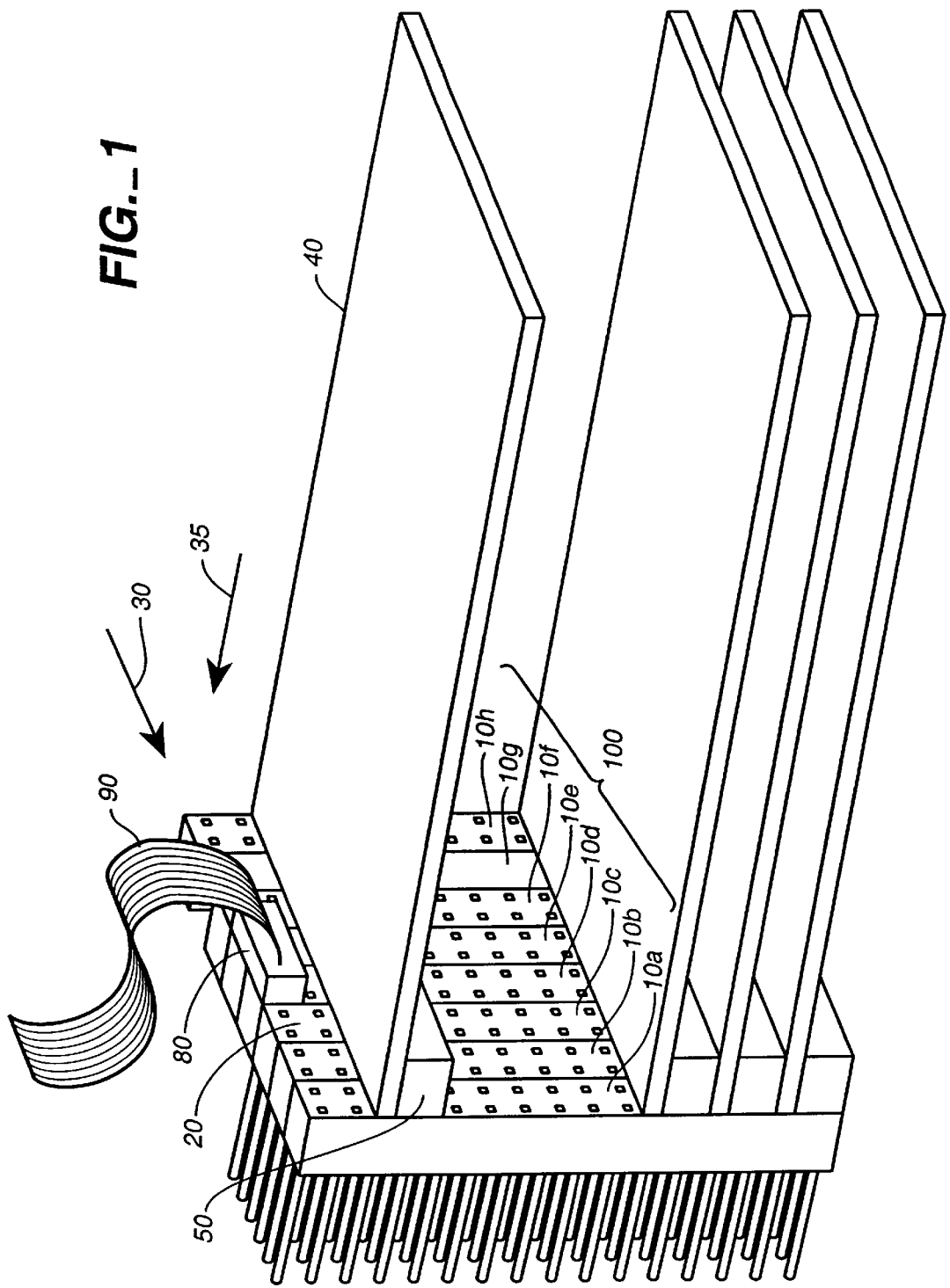
FIG._1

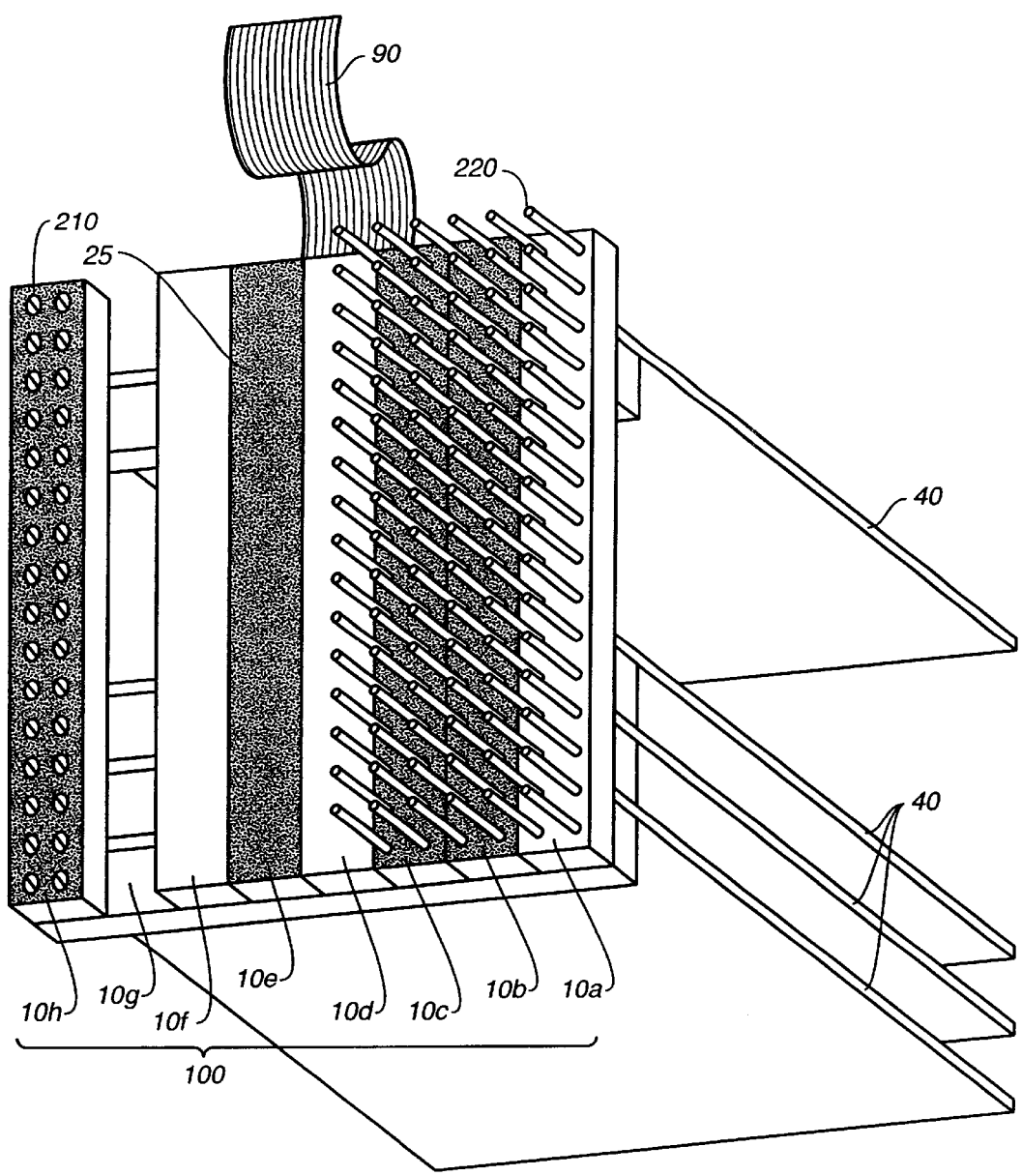
FIG._2

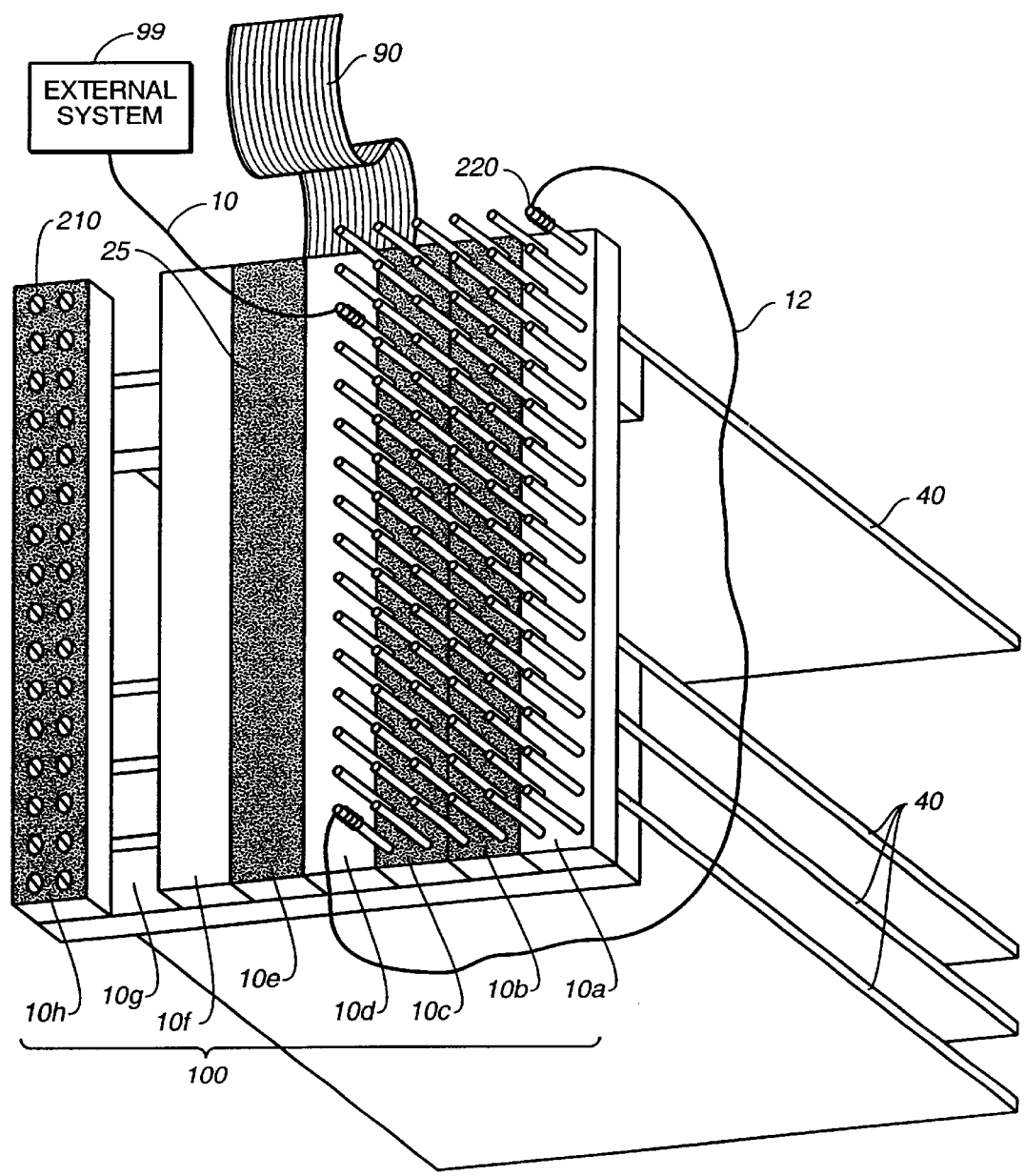
FIG._3

MODULAR BACKPLANE

FIELD OF THE INVENTION

The present invention relates to the field of prototype development and to the field of circuits and backplanes. More particularly, the present invention relates to prototyping circuits and backplanes by constructing a reusable and modular assembly providing improvements in cost, time, and reliability.

BACKGROUND OF THE INVENTION

Before an electronic product having electronic components and circuit boards is set for mass production, considerable time and resources are expended during the prototype development phase (or prototyping) in demonstrating the operational feasibility of the electronic product. In this early stage of development, the electronic product is assembled in a manner facilitating verification, debugging, and evaluation of the functionality of the electronic product without regard or with a lesser regard for mass production considerations. This assembly which is accomplished for convenience purposes is known as breadboarding. In general, the electronic product undergoes extensive modification and reengineering in the course of the breadboarding process aimed to building a prototype of the electronic product which meets the engineering and product specifications assigned to the electronic product.

Typically, an electronic product that requires extensive breadboarding during the prototype development phase (or prototyping) is a backplane. In general, a backplane is a circuit board, usually implemented as a printed circuit board, which supports other circuit boards, including printed circuit boards, and electronic components by providing an assembly platform and providing interconnections among the other circuit boards and electronic components through one or more buses, usually including data, signaling, power, and ground buses. There are numerous types of backplanes, each suited for one or more applications. For example, particular backplanes specialize in handling analog signals, digital signals, or both analog and digital signals. In addition, some backplanes specialize in high speed data transmission. Backplanes vary in size and shape, properties which tend to depend on the particular application for which the backplane is designed.

Moreover, backplanes can be described as being either active or passive. Active backplanes include, in addition to receptacles for receiving a circuit board, logical circuitry that performs computing functions. In contrast, passive backplanes have almost no logic circuitry. More importantly, passive backplanes make it easier to repair faulty electronic components and to upgrade to new electronic components.

In prototyping a backplane, any one of several conventional techniques is utilized. Occasionally, multiple circuit boards are hard-wired directly to one another. Sometimes, a previously designed backplane is reused after being moderately or extensively modified.

More commonly, a custom backplane is designed and manufactured or a wire-wrap backplane is built during the process of prototyping a backplane.

Constructing a custom backplane is a slow and expensive procedure. Delay in verifying, debugging, and evaluating the custom backplane because of the time spent on designing and manufacturing the custom backplane impedes the product development process. Since the custom backplane undergoes many changes during the prototyping stage, several custom backplanes need to be designed and manufactured over the course of the prototyping stage, thus amplifying the costs in time and resources.

Similarly, building a wire-wrap backplane from a wire-wrap board has been a traditional way of prototyping a backplane. This point-to-point wiring technique demands considerable time and patience in appropriately connecting a plurality of wire-wrap pins with wire-wrap wire. One additional attribute of a wire-wrap backplane lies in its high susceptibility to errors during its construction. In particular, errors can arise from having a defective wire-wrap wire connecting any one of the wire-wrap pills or from establishing a wire-wrap connection between the wrong wire-wrap pins. Lastly, the wire-wrap backplane is not well suited for reuse in a different backplane application.

What is needed is a reusable and modular assembly for prototyping circuits and backplanes effectuating reductions in costs, time, and construction errors.

SUMMARY OF THE INVENTION

The process of prototyping circuits such as a backplane or a circuit board has been modularized for achieving marked reductions in costs, time, and construction errors. Rather than repeating the recurring tasks of the prototyping process, such as making bus connections between different circuit boards, the present invention implements a plurality of modules which can be separably coupled into an assembly having a planar arrangement for prototyping circuits, where each module specializes in a particular task. In the preferred embodiment, the plurality of modules includes a data bus module, a switchable data bus module, a power bus module, and a wire-wrap module. Each one of the plurality of modules includes a coupling face configured for coupling to one or more circuit boards.

Since the assembly is constructed by simply coupling one or more modules to one another, the present invention facilitates rapid and cost-effective prototyping of a variety of backplanes as well as facilitates reuse of the assembly in multiple prototyping processes by simply separating the one or more modules from one another. Moreover, the bus modules are internally configured to couple one or more circuit boards together, thus substantially lowering the need for wire-wrapping. Hence, the construction errors associated with wire-wrapping are substantially reduced, leading to quality improvements.

BRIEF DESCRIPTION OF THE DRAWINGS

FIG. 1 illustrates a plurality of modules for prototyping according to the preferred embodiment of the present invention, showing the relationship between a first face of the modules and a plurality of printed circuit boards.

FIG. 2 illustrates the modules of FIG. 1, showing a second face of the modules.

FIG. 3 illustrates two of the pins on the assembly in a wire-wrapped connection with one another.

DETAILED DESCRIPTION OF THE PREFERRED EMBODIMENT

In the area of prototyping backplanes and circuits, improvements over the prior art are achieved by implementing a modularization technique. Although the discussion will focus on the prototyping of backplanes, the modularization technique of the present invention is equally applicable to the prototyping of other categories of circuits and circuit boards.

According to the present invention, a plurality of modules are developed to modularize the process of prototyping a backplane. Each module serves as a self-contained unit, specializing in handling a particular task of the backplane prototyping process. In particular, each module includes a coupling face which is configured for receiving one or more circuit boards having a card-edge connector, i.e., a connector that facilitates communication between signals which originate within a particular circuit board and signals which originate within other circuit boards and that facilitates coupling to other circuit boards. It should be understood that the phrase "circuit boards" as used herein includes printed circuit boards and any other appropriate circuit board implementations.

In practice, a backplane is prototyped by building a reusable assembly comprising multiple modules that are coupled to one another to form a planar arrangement, where the building process is rapid and simple. Modules are coupled to one another in a pattern that corresponds to the configuration of the card-edge connectors of the one or more circuit boards. By coupling the circuit boards to the coupling face of the modules in the assembly, a backplane can be prototyped with reduced costs, time, and construction errors.

FIG. 1 illustrates a backplane prototyping assembly 100 which is modular and reusable according to the preferred embodiment of the present invention. The backplane prototyping assembly 100 comprises a plurality of modules 10a, . . . , 10h, where each module 10a, . . . , 10h is separably coupled to one another to form a planar arrangement. Since the modules 10a, . . . , 10h are separably coupled to one another, the backplane prototyping assembly 100 is easily disassembled and reassembled for prototyping other backplane designs. The backplane prototyping assembly 100 of FIG. 1 illustrates the features of the present invention. However, the present invention is not limited to the backplane prototyping assembly 100 shown in FIG. 1. For example in alternate embodiments, the number of modules 10a, . . . , 10h can be increased or decreased and the location of the modules 10a, . . . 10h relative to one another within the backplane prototyping assembly 100 can be changed.

As illustrated in FIG. 1, the plurality of modules 10a, . . . , 10h form a planar arrangement. Preferably, the planar arrangement includes a first surface 20 configured for receiving one or more circuit boards 40 in a shelf arrangement, where the circuit boards 40 are circuit boards scheduled to be included in the backplane design to be prototyped with the backplane prototyping assembly 100. Additionally, the planar arrangement includes a second surface 25 (FIG. 2) configured for facilitating formation of one or more electrical connections among the one or more circuit boards 40. Preferably, the first surface 20 and the second surface 25 are formed on opposite faces of the plurality of modules 10a . . . , 10h.

Each circuit board 40 includes a card-edge connector 50 having a plurality of electrical terminals configured into one or more rows. In practice, each circuit board 40 is coupled to one or more modules 10a, . . . , 10h, where a coupling orientation 30 between modules 10a, . . . , 10h is perpendicular to a coupling orientation 35 between the circuit board 40 and the module 10a, . . . , 10h. This enables a modular approach to the prototyping of a backplane design since corresponding electrical terminals of each circuit board 40 can be electrically isolated within each module 10a, . . . , 10h. Thus facilitating the electrical coupling of these corresponding electrical terminals. For example, electrical terminals of each circuit board 40 which correspond to a power bus can be electrically coupled to one or more of the modules 10a, . . . , 10h which specializes in handling power distribution while electrical terminals corresponding to a particular data bus can be electrically coupled to one or more of the modules 10a, . . . , 10h which specializes in handling the particular data bus.

Since a bus system which comprises a plurality of parallel connections between the one or more circuit boards 40 forms a substantial part of a backplane, the modules 10a, . . . , 10h of the present invention eliminate costs, time, and construction errors associated with the prior art methods of prototyping a backplane design. The prior art methods of prototyping a backplane design generally require building the entire backplane prototype at one time and do not allow design flexibility and rapid design alterations. In contrast, the present invention allows building the backplane prototype one modular unit at a time, thus permitting rapid alterations and changes to be made to portions of the backplane prototype without affecting the remainder of the backplane prototype.

As illustrated in FIG. 1, the first surface 20 of the planar arrangement is configured for coupling to the card-edge connector 50 of each circuit board 40. In particular, each of the modules 10a, . . . , 10h includes a nonconductive housing having a first face, where the first face corresponds to the first surface 20 of the planar arrangement, and a second face, where the second face corresponds to the second surface 25 (FIG. 2) of the planar arrangement. Each first face (or coupling face) includes a plurality of electrical terminals configured into one or more rows for coupling to the electrical terminals of each card-edge connector 50. Although each first face illustrated in FIG. 1 is configured with female-type electrical terminals and each card-edge connector 50 illustrated in FIG. 1 is configured with male-type electrical terminals, it should be understood by those skilled in the art that the electrical terminals of the first face and the card-edge connector 50 can be alternately configured as any appropriate coupling configuration.

As discussed above, preferably each of the plurality of modules 10a, . . . , 10h of the present invention is designed to specialize in a particular task. In the preferred embodiment of the present invention, the plurality of modules 10a, . . . , 10h include data bus modules 10e, 10f, and 10g; a switchable data bus module 10h; a power bus module 10d; and wire-wrap modules 10a, 10b, and 10c. However, other types of modules can readily be designed and included to meet the needs of particular backplane prototyping processes, such as a signal bus module and a switchable signal bus module.

In practice, the multiple modules 10a, . . . , 10h are selected and separably coupled to one another according to the requirements of the particular backplane design undergoing the prototyping process.

The structure and configuration of the modules 10a, . . . , 10h can be better understood with reference to FIGS. 1 and 2. FIG. 1 illustrates the first surface 20 of the planar arrangement and the first face, which includes the electrical terminals, of the modules 10a, . . . , 10h. FIG. 2 illustrates the second surface 25 of the planar arrangement and the second face of the modules 10a, . . . , 10h .

The data bus modules 10e, 10f, and 10g include, along their longitudinal axis, a row of electrical terminals that are electrically coupled to one another inside the data bus modules 10e, 10f, and 10g. Thus, particular electrical terminals of each circuit board 40 can be coupled to the data bus module to verify, debug, and evaluate the data bus component of the backplane design under consideration.

The switchable data bus module 10h includes, along its longitudinal axis, a row of electrical terminals that selectively are electrically coupled to one another inside the switchable data bus module 10h, and a plurality of switches 210, where each of the switches 210 is coupled to a corresponding one of the electrical terminals of the row. Each of the switches 210 is configured to selectively couple the corresponding electrical terminal to the other electrical terminals of the row. As illustrated in FIG. 2, the second face of the switchable data bus module 10h provides access to each one of the plurality of switches 210. The switches 210 make it possible to selectively remove or include any of the circuit boards 40 from the data bus component during verification, debugging, and evaluation of the data bus component of the backplane design under consideration.

The power bus module 10d includes, along its longitudinal axis, a row of electrical terminals that are electrically coupled to one another inside the power bus module 10d. The row of electrical terminals is materially configured to support the voltage and current requirements of power distribution and ground distribution to each circuit board 40. In particular, the electrical terminals of the power bus module 10d are designed to withstand the higher voltage and current values associated with power and ground distribution compared to the voltage and current values associated with other components of the backplane design. The power bus module 10d simplifies prototyping the power bus component of a backplane design.

The wire-wrap modules 10a, 10b, and 10c include, along their longitudinal axis, a row of electrical terminals and a plurality of pins 220 extending from the second face of the wire-wrap modules 10a, 10b, and 10c, where each of the pins 220 is coupled to one of the electrical terminals of the row. Additionally, each of the pins 220 is configured for facilitating a wire-wrap connection. In particular, the plurality of pins 220 enable establishing non-bus and bus connections among the circuit boards 40. More importantly, since the data bus modules 10e, 10f, and 10g; the switchable data bus module 10h; and the power bus module 10d provide interconnectivity among the circuit boards 40, the amount of wire-wrapping needed is substantially reduced. Hence, construction errors arising in building a prototype of the backplane design are reduced, improving the quality of the backplane prototype.

FIG. 1 illustrates one method of incorporating into the backplane prototyping assembly 100 one or more signals that do not originate from the one or more circuit boards 40, such as power supply and output signals from another electrical system. As shown in FIG. 1, these signals are coupled to the first surface 20 through a connector 80, where the connector is coupled to a ribbon cable 90. Alternately, these signals (or external signals) can be wire-wrapped to the backplane prototyping assembly 100 through one of the wire-wrap modules 10a, 10b, and 10c. Similarly, other electronic components can be incorporated into the backplane prototyping assembly 100 through wire-wrapping or connectors coupled to the first surface 20.

Preferably, each of the modules 10a, . . . , 10h includes a nonconductive housing which is materially composed of a molded plastic, providing electrical isolation to each of the modules 10a, . . . , 10h. Alternatively, the nonconductive housing can be materially composed of any appropriate nonconductive material known to those skilled in the art. In addition, the electrical terminals of each of the modules 10a, . . . , 10h are materially composed of any appropriate conductive metallic material Moreover, the electrical terminals of each of the modules 10a, . . . , 10h can be configured to be compatible with any one of the card-edge connector standards, such as the 2 mm standard, .125 inch standard, or any other appropriate card-edge connector standard.

As illustrated in FIG. 2, the modules 10a, . . . , 10h can be designed to have different lengths. For example, the module 10g has a length that is ¼ of the length of the other modules. Similarly, the modules 10a, . . . , 10h can be designed to have different widths to accommodate the particular card-edge connector of the circuit boards 40 or to enable the modules 10a, . . . , 10h to provide a variety of electrical terminals to each circuit board 40. As should be apparent to those skilled in the art, a plurality of modules 10a, . . . , 10h including modules having a variety of lengths and widths will accommodate a greater variety of backplane designs.

As discussed above, each of the modules 10a, . . . 10h is capable of coupling to another module 10a, . . . , 10h in such a manner which allows the modules to be easily separated from one another. This feature is implemented by utilizing screws, utilizing a mechanical coupling, incorporating an interlocking feature on the nonconductive housing, or using in any other appropriate coupling feature that is known to those skilled in the art.

The present invention modularizes the backplane prototyping process. This modularization is accomplished through the implementation of a plurality of modules, each specializing in a particular task. Since the modules are reusable, costs associated with designing and manufacturing a custom backplane at the prototyping phase are avoided. More importantly, a savings in time during the prototyping phase is achieved through the ease of handling and arranging the modules into a reusable assembly which is readily configurable for receiving one or more circuit boards associated with the backplane design under consideration.

The above figures are merely intended to illustrate a particular implementation of the present invention, but are not intended to limit the scope of the present invention to this particular implementation.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiments chosen for illustration without departing from the spirit and scope of the invention.

What is claimed is:

1. An assembly for prototyping a backplane, comprising a plurality of modules, wherein each one of the plurality of modules is insulated and separably coupled to one or more of the plurality of modules to form a planar arrangement having a first surface configured for receiving one or more circuit boards in a shelf arrangement such that each one of the circuit boards is coupled to one or more of the modules and a second surface configured for facilitating formation of one or more electrical connections among the one or more circuit boards.

2. The assembly according to claim 1 wherein each circuit board includes a card-edge connector having a plurality of first electrical terminals configured into one or more rows, and further wherein each one of the plurality of modules includes a first face corresponding to the first surface of the planar arrangement, the first face having a plurality of second electrical terminals configured into one or more rows for coupling to the first electrical terminals, and a second face corresponding to the second surface of the planar arrangement.

3. The assembly according to claim 2 wherein one or more of the plurality of modules includes a row of second electrical terminals that are electrically coupled to one another within the module.

4. The assembly according to claim 2 wherein one or more of the plurality of modules includes a row of second electrical terminals that selectively are electrically coupled to one another within the module and a plurality of switches each coupled to a corresponding one of the second electrical terminals of the row, wherein each switch is configured to selectively couple the corresponding second electrical terminal to other second electrical terminals of the row, wherein the second face of the module provides access to each one of the plurality of switches.

5. The assembly according to claim 2 wherein one or more of the plurality of modules includes a row of second electrical terminals that are electrically coupled to one another within the module, wherein the row of second electrical terminals is configured to support power distribution to one or more circuit boards.

6. The assembly according to claim 2 wherein one or more of the plurality of modules includes a row of second electrical terminals that are electrically coupled to one another within the module, wherein the row of second electrical terminals is configured to support ground distribution to one or more circuit boards.

7. The assembly according to claim 2 wherein one or more of the plurality of modules includes a row of second electrical terminals and a plurality of pins extending from the second face of the module, wherein each of the plurality of pins is coupled to a corresponding one of the second electrical terminals of the row and is configured for facilitating a wire-wrap connection.

8. The assembly according to claim 1 wherein the plurality of modules are of multiple lengths.

9. The assembly according to claim 1 wherein the plurality of modules are of multiple widths so that the first surface receives a plurality of circuit board configurations.

10. The assembly according to claim 1 wherein the first surface of the planar arrangement is configured to receive one or more signals not originating from the one or more circuit boards.

11. The assembly according to claim 10 wherein the one or more signals are coupled to the first surface through a connector.

12. A module for prototyping circuits, the module comprising:
   a. a nonconductive housing having a first face for receiving one or more circuit boards, and a second face positioned opposite the first face, wherein the nonconductive housing is configured for separably coupling to a second nonconductive housing which is separate from the module to form a planar arrangement; and
   b. a plurality of electrical terminals configured for coupling to one or more connectors each of which is coupled to a circuit board, wherein the electrical terminals are positioned on the first face.

13. The module according to claim 12 wherein the plurality of electrical terminals includes a row of second electrical terminals that are electrically coupled to one another within the nonconductive housing.

14. The module according to claim 12 wherein the plurality of electrical terminals includes a row of second electrical terminals that selectively are electrically coupled to one another within the nonconductive housing and a plurality of switches each coupled to a corresponding one of the second electrical terminals of the row, wherein each switch is configured to selectively couple the corresponding second electrical terminal to other second electrical terminals of the row, wherein the second face provides access to each one of the plurality of switches.

15. The module according to claim 12 wherein the plurality of electrical terminals includes a row of second electrical terminals that are electrically coupled to one another within the nonconductive housing, wherein the row of second electrical terminals is configured to support power distribution to one or more circuit boards.

16. The module according to claim 12 wherein the plurality of electrical terminals includes a row of second electrical terminals that are electrically coupled to one another within the nonconductive housing, wherein the row of second electrical terminals is configured to support ground distribution to one or more circuit boards.

17. The module according to claim 12 wherein the plurality of electrical terminals includes a row of second electrical terminals and a plurality of pins extending from the second face, wherein each of the plurality pins is coupled to a corresponding one of the second electrical terminals of the row and is configured for facilitating a wire-wrap connection.

18. The module according to claim 12 wherein the one or more connectors are card-edge connectors.

19. A method of prototyping circuits, the method comprising the steps of:
   a. coupling a plurality of modules together to form a planar arrangement having a first surface and a second surface, wherein each module is separably coupled to one or more adjacent modules, each module being configured to electrically couple to one or more circuit boards,
   b. coupling one or more circuit boards to the first surface such that each circuit board is coupled to one or more of the modules; and
   c. forming one or more appropriate electrical connections among the one or more circuit boards, wherein the second surface is configured to facilitate formation of the one or more appropriate electrical connections.

20. The method according to claim 19 wherein each of the one or more circuit boards includes a card-edge connector for coupling to the first surface.

21. The method according to claim 19 further comprising the step of coupling one or more signals not originating from the one or more circuit boards to the first surface through a connector.

* * * * *

UNITED STATES PATENT AND TRADEMARK OFFICE
CERTIFICATE OF CORRECTION

PATENT NO. : 6,344,975                        Page 1 of 1
DATED : February 5, 2002
INVENTOR(S) : Christopher R. Gayle It is certified that error appears in the above-identified patent and that said Letters Patent is hereby corrected as shown below:

<u>Column 2,</u>
Line 12, replace "wire-wrap pills" with -- wire-wrap pins --.

Signed and Sealed this

Twenty-third Day of April, 2002

Attest:

JAMES E. ROGAN
*Attesting Officer*        *Director of the United States Patent and Trademark Office*